United States Patent
Kahl et al.

[11] Patent Number: 6,096,158
[45] Date of Patent: Aug. 1, 2000

[54] PROCESS FOR PRODUCING AN ELECTROMAGNETICALLY SCREENING SEAL

[76] Inventors: Helmut Kahl, Horstwalder Str. 23, 12307, Berlin; Bernd Tiburtius, Rosenhag 10, 14532, Kleinmachow, both of Germany

[21] Appl. No.: 09/241,093

[22] Filed: Feb. 1, 1999

Related U.S. Application Data

[63] Continuation of application No. PCT/IB97/00952, Jul. 29, 1997.

[30] Foreign Application Priority Data

Aug. 1, 1996 [DE] Germany .......................... 196 36 856

[51] Int. Cl.[7] .................................................. H05K 9/00
[52] U.S. Cl. ...................... 156/292; 156/578; 156/307.7
[58] Field of Search .................... 156/292, 307.7, 156/578

[56] References Cited

U.S. PATENT DOCUMENTS 4,659,869  4/1987  Busby ............................... 174/35 GC

FOREIGN PATENT DOCUMENTS

| | | |
|---|---|---|
| 0 182 391 | 5/1986 | European Pat. Off. . |
| 0 241 192 | 10/1987 | European Pat. Off. . |
| 0 629 114 | 12/1994 | European Pat. Off. . |
| 0 643 551 | 3/1995 | European Pat. Off. . |
| 0 643 552 | 3/1995 | European Pat. Off. . |
| 0 654 962 | 5/1995 | European Pat. Off. . |
| 94 04 291 U | 6/1994 | Germany . |
| 94 04 291 | 7/1994 | Germany . |
| 96 08946 | 3/1996 | WIPO . |
| WO 96/08946 | 3/1996 | WIPO . |
| 96 22672 | 7/1996 | WIPO . |
| WO 96/22672 | 7/1996 | WIPO . |

OTHER PUBLICATIONS

PCT International Search Report, Oct. 23, 1997, PCT Application 97/00952.

*Primary Examiner*—Francis J. Lorin
*Attorney, Agent, or Firm*—Finnegan, Henderson, Farabow, Garrett & Dunner, L.L.P.

[57] ABSTRACT

This invention concerns a process for producing an electromagnetically screening seal (15) which consists of a substrate (10) to which a sealant strand (14) out of an elastic and electrically conducting sealant material is firmly affixed. In this process a curable elastic and electrically conducting sealant material in paste form is applied to adhere in a pre-set geometrical pattern to the substrate (10) and subsequently is cured. The flexibility in the application is increased in that the sealant is applied to the substrate (10) through a nozzle (13) in the form of a sealant strand (14) by means of an application device (12) which moves relative to the substrate (10). The sealant strand (14) then is cured.

28 Claims, 5 Drawing Sheets

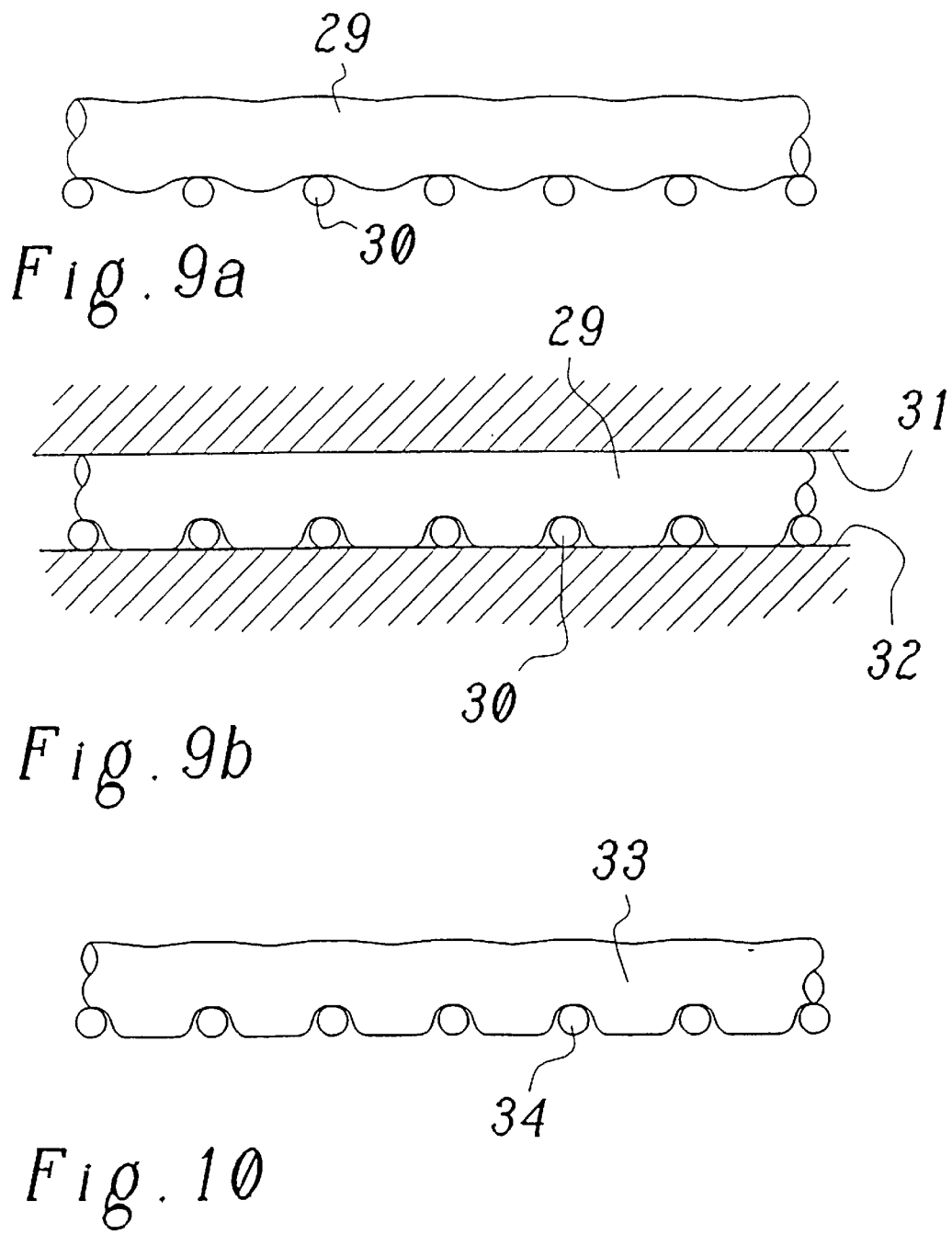

PROCESS FOR PRODUCING AN ELECTROMAGNETICALLY SCREENING SEAL

This application is a continuation of prior PCT/IB97/00952 filed Jul. 29, 1997.

TECHNICAL FIELD

The present invention concerns the field of screening. It deals with a process to create an electromagnetically-screening seal that comprises a substrate with a sealing bead fixed tightly to a substrate consisting of an elastic, electrically conductive sealing material. In the process, a hardening, elastic and electrically-conductive sealing material is adhered as a paste in a predetermined geometric pattern to the substrate and then hardened.

Such a process in which the sealing material is applied to the bearing substrate by screen printing is e.g. found in EP A2 0 241 192.

BACKGROUND OF THE INVENTION

It has been prior art for a long time to use elastic, electrically conductive seals for sealing electromagnetically-screened multi-component housing, etc. The seals securely close the gaps between the housing parts and provide a good electrical contact between the (electrically-screening) housing parts. Such seals consist of tubes made of wire mesh or metallic fleeces, or frequently an elastomer mixed with conductive fillers (carbon particles, copper or silver particles, metallically-coated spheres, silver-coated particles, etc.). The elastomer is used in an unhardened state to form a corresponding sealing bead or strip. The formed bead is then hardened (by heat, radiation, humidity, etc.). In U.S. Pat. No. 4 659,869, a screening seal is described where a sealing element made of a conductive elastomer is extruded in the form of a tube and then connected to an elongated clamping strip made of metal. This type of seal is very involved to manufacture due to the clamping strip. In addition, it can only be used for limited instances because there must be a straight, strip-like edge of sheet metal on the housing on which to clamp the clamping bead. In particular, this technique cannot be used to create an annular closed seal with complicated dimensions.

Another type of screening seal is described in the initially-cited EP A2 0 241 192. A flat substrate in the form of an annular strip is printed on one or both sides by screen printing with one or more sealing beads made of an electrically-conductive elastomer. Silk screen printing makes it easy to create different seal shapes in contrast to the above-cited case. The use of silk screen printing also has disadvantages, however. Each seal shape must be created in correspondingly shaped screen. Although this does not provide a limitation for large-scale series production, small-scale series are not economical due to the frequently changing shapes. Furthermore, silk screen printing can only create seal beads that have a uniform, essentially rectangular cross-section. Variations of the height or cross-section are nearly impossible with silk screen printing. Finally, it is impossible to change the composition of the seal material in relation to the site to e.g. adjust the reaction to pressure, etc. of the seal bead.

Another sealing technique for screening seals that is not limited as above has been suggested by the applicant in an earlier patent application (EP A10 629 114). In this sealing technique, the seal bead is applied directly to a surface of the housing to be sealed. The sealant is applied as a pasty, electrically-conductive elastomer by an applicator with a nozzle in the form of a bead. The applicator follows the shape of the seal like a robot that is controlled along several axes. With this technique (termed "form-in-place"), the sealing bead is hardened on the sealing surface as shaped by and applied by the nozzle. Suitable sealing materials for this process are e.g. disclosed in EP A10 643 551 and EP Al 0 643 552.

The form-in-place technique is very flexible to use, can be economically used for large-scale and small-scale series, and can easily create seals for very small housings with complicated shapes. Additionally by controlling the supply of the sealing material to the nozzle, the composition and cross-section of the sealing bead can be easily varied in relation to the site. Finally, it is easy to create complicated cross-sections of the sealing bead and hence special characteristics of the seal by applying several parallel individual beads either sequentially or with multiple nozzles.

With the form-in-place technique, at least the housing part (or the printed circuit board) that has the surface to which the seal is applied must be at the site of manufacture for the seal bead to be applied. However, it would be desirable to use the indisputable advantages of the form-in-place technique for those instances in which the parts to be sealed are not at the site of manufacture.

SUMMARY OF THE INVENTION

The problem of the invention is to present a process to manufacture a screening seal that has the flexibility of the form-in-place process, and to create a seal that can be stored and transported apart from the part to be sealed and used away from the site of manufacture.

The problem is solved by a process of the initially cited type by the features from the characterizing portion of claim 1. By creating the sealing bead on a separate flexible substrate that forms the complete seal together with the sealing bead, the two processes of creating the seal and installing the seal can be separated from each other. The seal is given the necessary mechanical stability from the substrate that can be stored and transported separately and installed at a later time on the sealing surface. The substrate can be flexibly adapted to the different requirements.

A first preferred embodiment of the process according to the invention is characterized in that the sealing bead consists of several individual beads, and either the individual beads of the sealant are applied from a nozzle sequentially to the substrate, or the individual beads of the sealant are simultaneously applied to the substrate from several nozzles. Very different cross-sections can be advantageously created that have correspondingly different characteristics. A second preferred embodiment of the process according to the invention is characterized in that the sealing material is applied to a substrate sheet, and then areas of the substrate sheet with the sealing bead are cut out to form the seal. By limiting the substrate to the areas covered by the sealing bead, the seal takes less space.

In another preferred embodiment, a flexible film, is used as the substrate that is either electrically insulating (especially made of a plastic); or the substrate is an electrically conductive, especially metal film or plastic film metallized on one or both sides; or the substrate is a fabric, grate or net that either is electrically insulating (especially of plastic), or electrically conductive, especially a metal fabric, grate or net, or a nonwoven fabric. The substrates in the form of films, fabrics, grates, nets and nonwovens can be easily adapted to difficult shapes.

Another preferred embodiment of the process according to the invention is characterized in that a substrate is used that has cut-outs in the area of the sealing bead through which the sealing bead can contact the surface on which rests the seal with the substrate. Such perforated substrates like perforated plates, coarse fabrics, nets, grates, etc. allow a direct electrical connection to be provided by the sealing bead with the top and bottom sealing surface.

Other embodiments are found in the dependent claims.

BRIEF DESCRIPTION OF THE DRAWINGS

The invention will be further explained in the following with reference to exemplary embodiments in connection with the drawings. Shown are:

FIG. 9a A side view of the seal comparable with FIG. 7 in which the sealing bead is in an unpressed state above the substrate;

FIG. 9b A side view of the seal comparable with FIG. 7 in which the sealing bead is in a pressed state and contacts the bottom surface through the substrate; and FIG. 10. A seal comparable to FIG. 9 in which the sealing bead provides contact through the substrate even when no pressure is applied.

DETAILED DESCRIPTION OF PREFERRED EMBODIMENTS

Figure 1:
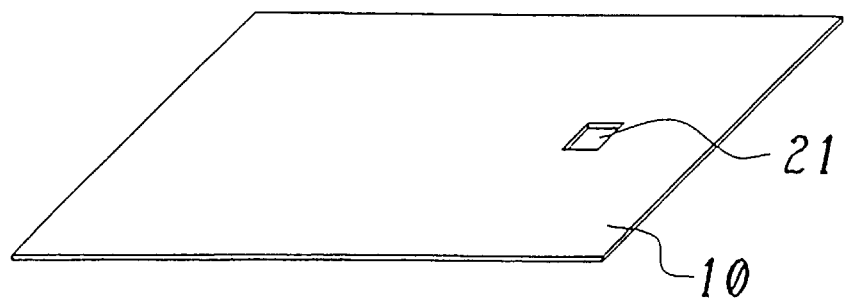
FIG. 1. Perspective view of an example of a substrate sheet for the process according to the invention.

The process according to the invention is based on a thin, preferably flat substrate 10 as shown in FIG. 1. The substrate 10 can have one or more cut-outs 21 (the significance of which will be discussed below) at predetermined sites. Whereas FIG. 1 only shows an example of a cut-out 21, it is easily conceivable to place cut-outs throughout the entire substrate 10 surface as is e.g. the case with a perforated plate or film.

The substrate 10 is designed to be flexible. An electrically conductive or nonconductive substrate can be used. Preferably, films, fabrics, grids, nets or nonwovens can be used that either consist of metal (metal films or fabrics, grids or nets or mats) or one or more metallized plastics.

Figure 2:
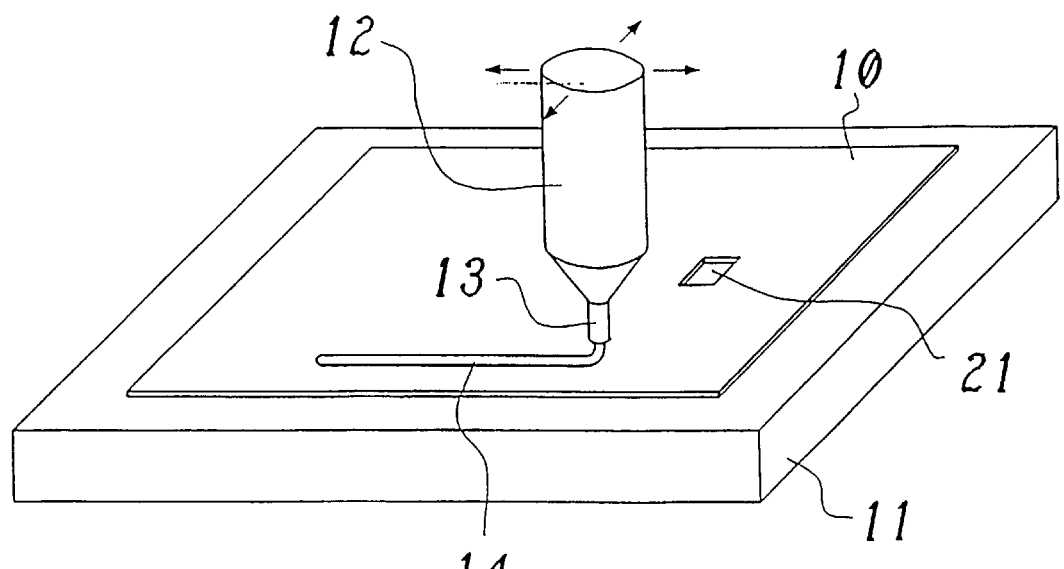
FIG. 2. The application of the sealing bead to the substrate from FIG. 1 according to a preferred exemplary embodiment of the invention.

To create the seal, the substrate 10 sheet from FIG. 2 is placed on a suitable, stable base 11 and sufficiently fixed. Using an applicator 12 that can be moved relative to the base 11 or the substrate 10 on it along several axes, an elastic, electrically-conductive, unhardened, pasty sealing material is applied on the substrate 10 under pressure from a nozzle 13 in the form of a sealing bead 14. The applicator 12 automatically follows geometric patterns that corresponds to the path of the subsequent seal.

The relative movement of the applicator 12 in relation to the base 11 or substrate 10 can be such that the base 11 is held and the applicator 12 is moved above, or the applicator 12 can be held and the base 11 is moved with the substrate 10 below the applicator 12. Possible applicators 12 are e.g. a device that is described in European patent application EP A10 629 114 by the applicant. A possible sealing material for the sealing bead is preferably an elastomer mixed with an electrically-conductive filler as e.g. the composition described in EP A10 643 551 and EP A10 643 552. The hardening that causes the bead to permanently adhere to the substrate 10 can be carried out in many ways, especially by heat or the effect of humidity.

Figure 3:
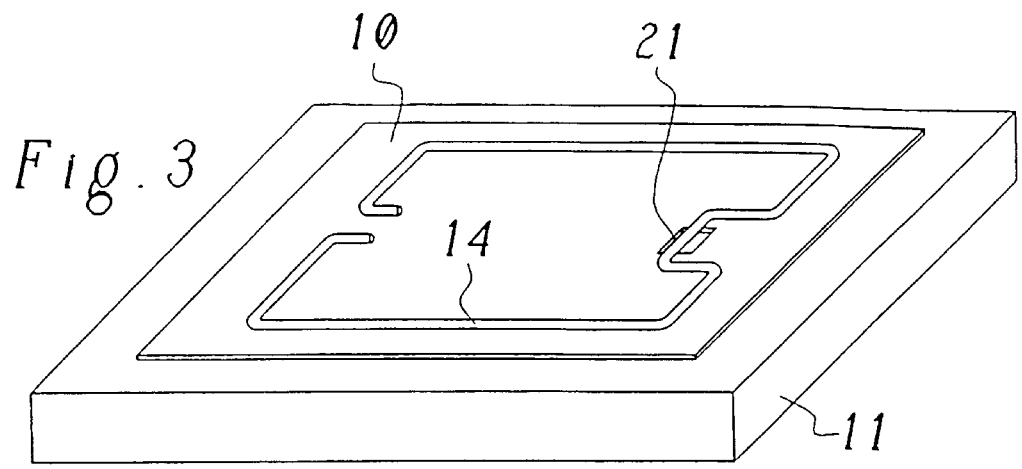
FIG. 3. The finished sealing bead applied using the procedure in FIG. 2.
Figure 4:
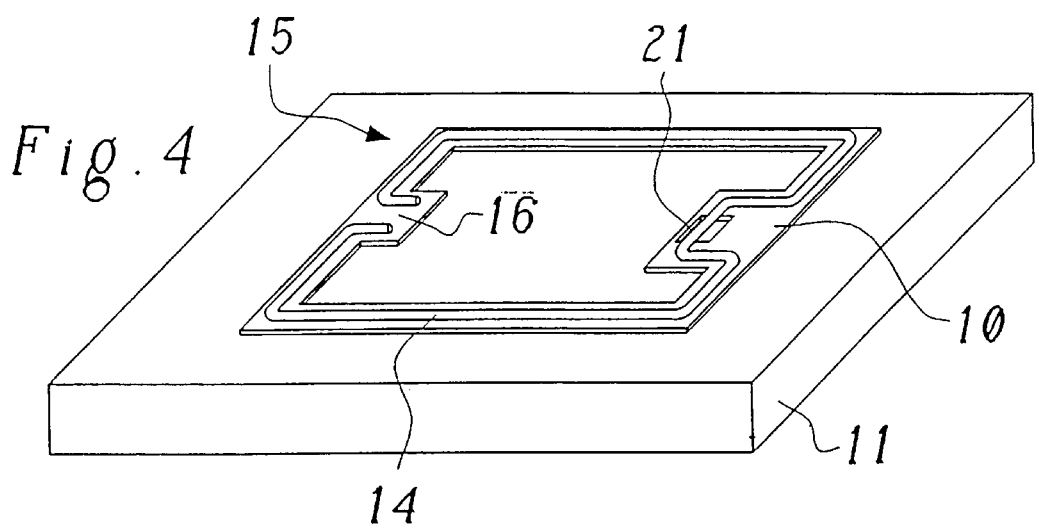
FIG. 4. Examples of removing the substrate areas from the sheet of substrate that are covered with the sealing bead from FIG. 3.

When application is finished, the state arises that is shown in FIG. 3 in which the substrate 10 is covered with a complete (open or closed, annular, meandering, labyrinthine, etc.) sealing bead 14. In another (optional) step, the area of the substrate 10 covered by the sealing bead 14 is stamped out of the substrate 10 sheet or e.g. cut out with a laser beam or a high-pressure water jet to produce a finished seal 15 that consists of the (cut out) substrate 10 and the tightly adhering sealing bead 14. It is also possible to conversely first cut out from the sheet the areas that are to bear the sealing bead, and then apply the sealing material to form the seal on the cut out areas.

Figure 5:
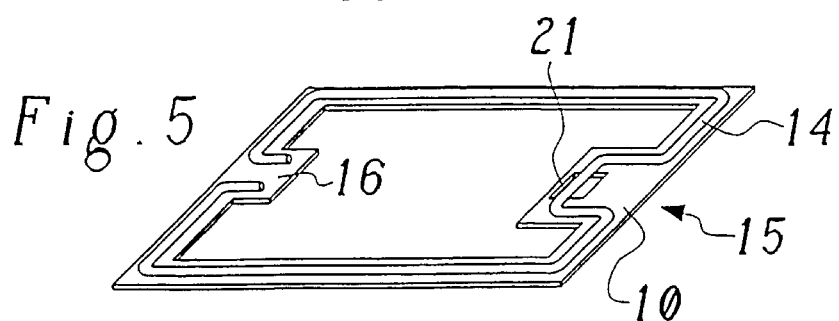
FIG. 5. The seal ready for use created by the steps represented in FIG. 2–4.

It can be particularly advantageous when the cut-out substrate 10 is continuous at a site where the sealing bead has an interruption 16 because of the purpose for which it is used. This makes it easier and safer to handle the seal even at the loose ends of the sealing bead 14. The finished seal 15 can then be removed from the base 11, and it is ready to be transported in the form in FIG. 5, to be stored or to be directly used.

Figure 6:
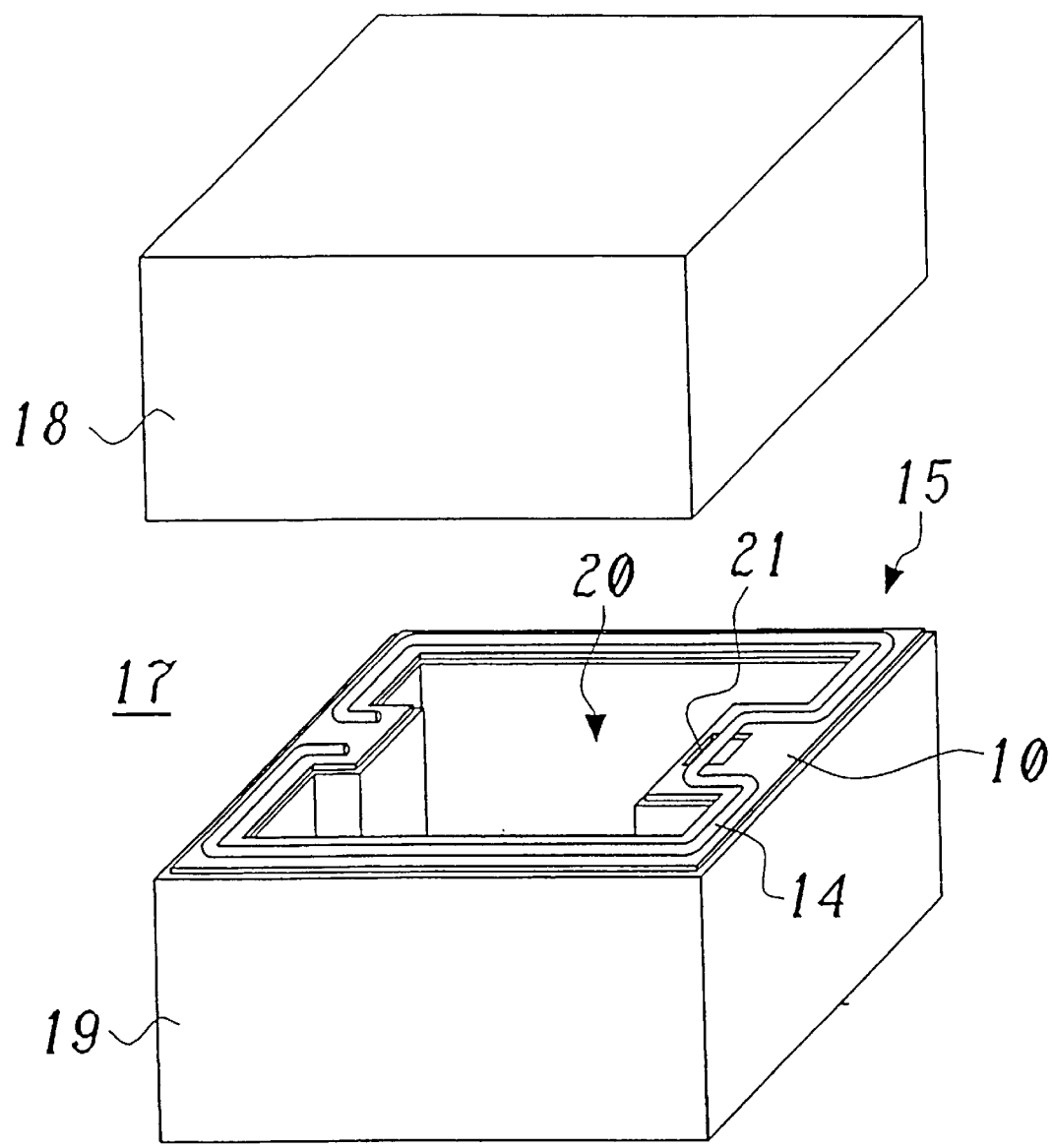
FIG. 6. The use of the seal from FIG. 5 to provide an EMI seal of an exemplary housing consisting of a top and bottom part.
Figure 7:
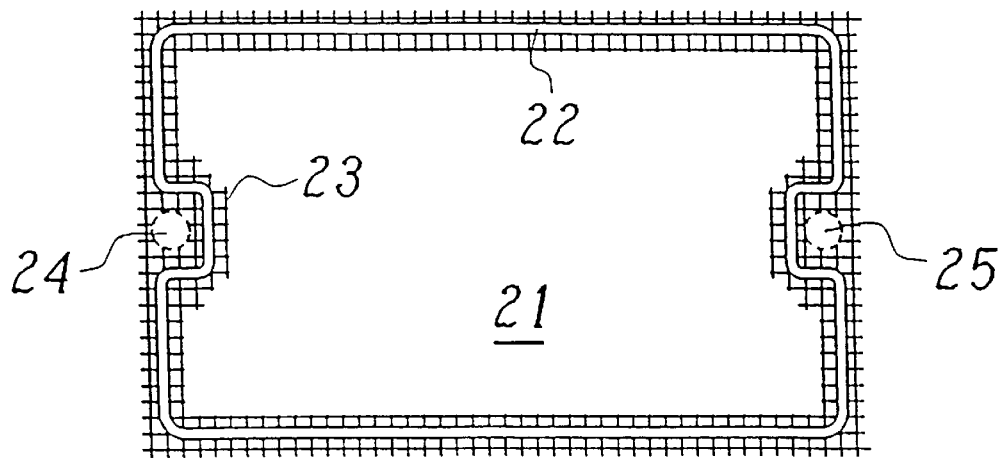
FIG. 7. A top view of a seal created by the process according to the invention with a grid shaped substrate with net lines are parallel to the seal bead.

FIG. 6 shows an exemplary use of the invention on an electrically-screening housing 17 that consists of a top housing part 18 and a bottom housing part 19 and an interior 20 to be screened. The seal 15 illustrated in FIG. 5 whose cut-out edge is preferably adapted to the sealing surface of the housing 17 is e.g. placed loosely or glued on the sealing surface of the bottom housing part 19. It can be adjusted or mechanically fixed by providing holes (24, 25 in FIG. 7) in the substrate 10 (as described below in relation to FIG. 7) that can be used to shove the substrate 10 on corresponding posts or pins on the bottom sealing surface. The top housing part 18 that has a corresponding sealing surface is then placed on the seal 15, the sealing bead 14 is pressed, and the housing 17 becomes electromagnetically sealed. At the cut-out 21, the sealing bead 14 is pressed through the cut-out 21 onto the sealing surface of the bottom housing part directly below the substrate 10 so that the sealing bead provides an electrical contact in the area of the cut-out 21 with both housing parts 18, 19 (through contacting). This is particularly important when an insulating film or plate is used as the substrate 10, and the top and bottom parts are to be electrically connected. The through contact between the top and bottom parts is particularly easy to obtain over a wide surface when a wide-mesh fabric, grate or net (of plastic or metal) is used as a substrate for the seal as in FIG. 7–10. In the exemplary embodiment in FIG. 7, the seal 21 is formed by a sealing bead 22 that is applied to a grid-like substrate 23. The sealing bead 22 is parallel to the grid lines. If the grid lines in the lengthwise direction do not expand, the parallel orientation restricts the stretching of the sealing bead 22 and hence protects it from over stretching.

In the substrate 23, there are e.g. two circular (e.g. stamped or cut) openings 24 and 25 surrounded by the sealing bead 22. During installation, the seal 21 can be shoved on corresponding posts or pins on the bottom housing part or on the bottom sealing surface that simultaneously makes it easier to join the housing parts. The automatically adjusts the seal 21 relative to the housing. When the posts or pins are correspondingly shaped, the seal 21 can be mechanically fixed on the bottom sealing surface.

Figure 8:
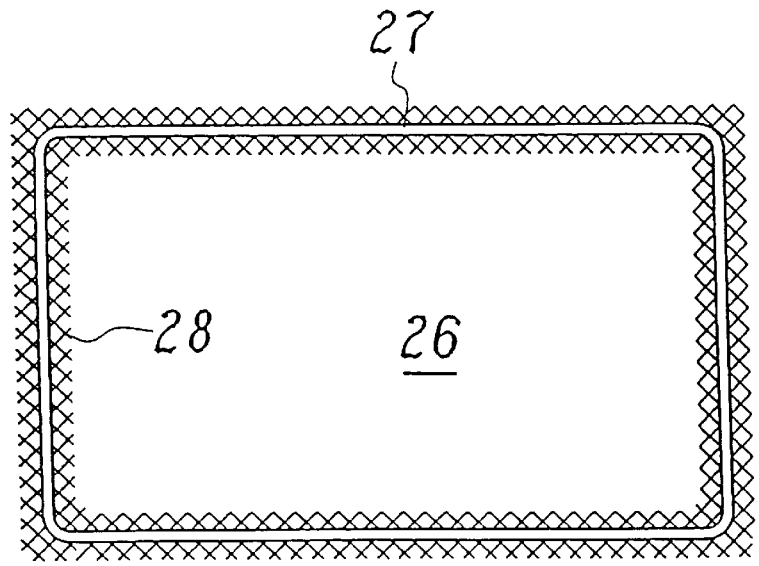
FIG. 8. A top view of a seal manufactured by the process of the invention with a grid-like substrate, whereby the net lines are at an angle to the sealing bead.

Another example of the seal according to the invention is shown in FIG. 8. The seal 26 comprises a closed sealing bead 27 that is also applied to a grid-like substrate 28. In this case, the grid lines are angled in relation to the sealing bead 27. If the grid lines can bend with this orientation, the substrate 28 and the sealing bead can be stretched in the lengthwise direction of the bead. This makes it easier to adapt the seal 26 to different shapes.

When using grid-shaped substrates, whether or not the finished sealing bead can penetrate the substrate and make contact largely depends on the thickness of the substrate (thickness of the strings or grid wire), the mesh width, and the sealant viscosity when it is applied. FIG. 9a shows a side view of an instance in which the sealing bead 29 is largely above the grid-like substrate 30 after the bead hardens (when not subjected to pressure). The bead does not extend through the substrate 30. Only when it is used (FIG. 9b), the (elastic) sealing bead 29 is pressed between the two sealing surfaces 31 and 32 and passes through the substrate 30 to the bottom sealing surface 32 and hence closes the gap between the top and bottom sealing surface 31 and 32.

If the mesh width of the substrate is larger or the viscosity of the sealant is less when it is applied, a seal results as in FIG. 10 in which the sealing bead 33 extends downward through the mesh of the grid-shaped substrate 34 even when no pressure is applied. In this manner, the disturbing influence of a nonconducting substrate (plastic weave or grid) on the screening properties can be reduced to a minimum.

Overall, the process according to the invention produces a screening seal that is distinguished by the following advantages:

Simple and economical manufacture,

Flexible to use even with complicated and involved shapes,

Any substrate (base material) can be selected within wide limits, and it can be optimized to the respective application, The finished seal is easy and safe to handle, The seal can be manufactured apart from the housing.

The foregoing description of the preferred embodiments of the present invention has been provided for the purpose of illustration and description. It is not intended to be exhaustive or to limit the invention to the precise forms disclosed. Obviously many modifications, variations and simple derivations will now become apparent to practitioners skilled in the art. The embodiments were chosen and described in order to best explain the principles of the invention and its practical application, thereby enabling others skilled in the art to understand the invention for various embodiments and with various modifications are suited to the particular use contemplated. It is intended that the scope of the invention be defined by the following claims and their equivalents.

| REFERENCE NUMBER LIST | |
| --- | --- |
| 10 | Substrate |
| 11 | Base |
| 12 | Applicator |
| 13 | Nozzle |
| 14 | Sealing bead |
| 15 | Seal |
| 16 | Space |
| 17 | Housing |
| 18 | Top housing part |
| 19 | Bottom housing part |
| 20 | Interior (housing) |
| 21, 26 | Seal |
| 22, 27 | Sealing bead |
| 23, 28 | Substrate (grid or net) |
| 24, 25 | Opening |
| 29, 33 | Sealing bead |
| 30, 34 | Substrate (grid or net) |
| 31, 32 | Sealing surface |

What is claimed is:

1. A process for manufacturing an electromagnetically screening sealing element comprising a substrate and a sealing bead of a predetermined geometrical pattern placed on and adhering to said substrate, said process comprising:

placing a substrate on a stable base;

fixing said substrate to said stable base;

applying a hardening, elastic, and electromagnetically-conductive sealing material as a paste from a nozzle with an applicator in said predetermined geometric pattern to said substrate in the form of said sealing bead, whereby said applicator can move relative to said substrate and can follow said predetermined geometric pattern, and hardening said elastic and electromagnetically-conductive sealing-material as said sealing bead.

2. A process according to claim 1, wherein said applying of the hardening, elastic, and electromagnetically-conductive sealing material as a paste in a predetermined geometric pattern to a substrate includes applying several individual beads to make up the sealant bead.

3. A process according to claim 2, wherein said applying of several beads includes applying the individual beads of the sealant bead sequentially from the nozzle to the substrate.

4. A process according to claim 1, further comprising mixing an elastomer with an electrically conductive filler to form a mixture and using the mixture as the sealant bead.

5. A process according to one of claim 3, further comprising mixing an elastomer with an electrically conductive filler to form a mixture and using the mixture as the sealant bead.

6. A process according to one of claims 1–5, wherein said applying of sealant bead includes applying the sealant bead to a sheet of substrate, and removing the areas covered with the sealant bead from the sheet of substrate such that these areas form the seal.

7. A process according to claim 6, wherein said removing of the areas covered with the sealant bead are removed from the sheet of substrate by stamping.

8. A process according to claim 6, wherein said removing of the areas covered with the sealant bead are removed from the sheet of substrate by cutting, especially by a laser or water jet.

9. A process according to one of claims 1–5, further comprising the step of removing the areas that will later bear the sealing bead from the sheet of substrate, and applying the sealant is to the cut-out areas to form the seal.

10. A process according to one of claim 6 further comprising using a flexible film as the substrate (10).

11. A process according to claim 10, further comprising using a film that is electrically insulating and especially consists of a plastic.

12. A process according to claim 10, further comprising using a film that is electrically conductive, and is especially a metal film or a plastic film metallized on one or both sides.

13. A process according to claim 6 further comprising using a fabric, grid or net as the substrate.

14. A process according to claim 13, further comprising using a fabric, grid or net that is electrically insulating and especially consists of a plastic.

15. A process according to claim 14, further comprising using a the fabric, grid or net that is electrically conductive and is especially a metal fabric, grid or net.

16. A process according to claim 6 further comprising using a nonwoven as the substrate.

17. A process according to one of claims 1–5, further comprising using a substrate that has holes in the area of the sealing bead through which the sealing bead can contact the surface on which lies the seal with the substrate.

18. A process according to one of claims 1–5, further comprising providing openings in the substrate to adjust and/or fix the seal to a sealing surface.

19. A process according to claim 9 further comprising using a flexible film as the substrate.

20. A process according to claim 19, further comprising using a film that is electrically insulating and especially consists of a plastic.

21. A process according to claim 19, further comprising using a film that is electrically conductive, and is especially a metal film or a plastic film metallized on one or both sides.

22. A process according to claim 9 further comprising using a fabric, grid or net as the substrate.

23. A process according to claim 22, further comprising using a fabric, grid or net that is electrically insulating and especially consists of a plastic.

24. A process according to claim 23, further comprising using a the fabric, grid or net that is electrically conductive and is especially a metal fabric, grid or net.

25. A process according claim 9 further comprising using a nonwoven as the substrate.

26. A process of manufacturing an electromagnetically screening sealing element comprising a substrate and a sealing bead of a predetermined geometrical pattern placed on and adhering to said substrate, said process comprising:

placing a substrate on a stable base;

fixing said substrate to said stable base;

applying a hardening, elastic, and electromagnetically-conductive sealing material as a paste from a nozzle with an applicator in said predetermined geometric pattern to said substrate in the form of said sealing bead;

wherein said applying of said sealant bead includes applying said sealant bead to a sheet of substrate, and removing the areas covered with said sealant bead from said sheet of substrate such that these areas form said sealing element;

whereby said applicator can move relative to said substrate and can follow said predetermined geometric pattern; and hardening said elastic and electromagnetically-conductive sealing-material as said sealing bead.

27. A process for manufacturing an electromagnetically screening sealing element comprising a substrate and a sealing bead of a predetermined geometrical pattern placed on and adhering to said substrate, said process comprising:

placing a substrate on a stable base, thereby using a flexible film as said substrate;

fixing said substrate to said stable base;

applying a hardening, elastic, and electromagnetically-conductive sealing material as a paste from a nozzle with an applicator in said predetermined geometric pattern to said substrate in the form of said sealing bead, whereby said applying of sealant bead includes applying said sealant bead to a sheet of substrate, and removing the areas covered with the sealant bead from the sheet of substrate such that these areas from said sealing element;

whereby said applicator can move relative to said substrate and can follow said predetermined geometric pattern; and hardening said elastic and electromagnetically-conductive sealing-material as said sealing bead.

28. A process of manufacturing an electromagnetically screening sealing element comprising a substrate and a sealing bead of a predetermined geometrical pattern placed on and adhering to said substrate, said process comprising:

placing a substrate on a stable base, thereby using a fabric, grid or net as said substrate;

fixing said substrate to said stable base;

applying a hardening, elastic, and electromagnetically-conductive sealing material as a paste from a nozzle with an applicator in said predetermined geometric pattern to said substrate in the form of said sealing bead, wherein said applying of sealant bead includes applying said sealant bead to a sheet of substrate, and removing the areas covered with said sealant bead from said sheet of substrate such that these areas form said sealing element;

whereby said applicator can move relative to said substrate and can follow said predetermined geometric pattern; and hardening said elastic and electromagnetically-conductive sealing-material as said sealing bead.

* * * * *

UNITED STATES PATENT AND TRADEMARK OFFICE
CERTIFICATE OF CORRECTION

PATENT NO. : 6,096,158
DATED : August 1, 2000
INVENTOR(S) : Helmut Kahl et al.

It is certified that error appears in the above-identified patent and that said Letters Patent is hereby corrected as shown below:

Column 6, claim 5,
Line 50, before "claim 3", delete "one of".

Column 7, claim 9,
Line 2, after "sealant", delete "is".

Column 7, claim 10,
Line 3, before "claim 6", delete "one of"
Line 4, after "substrate", delete "(10)".

Column 7, claim 15,
Line 17, after "using a", delete "the".

Column 7, claim 24,
Line 42, after "using a", delete "the".

Column 7, claim 25,
Line 44, after "according", insert -- to --.

Column 8, claim 27,
Line 26, "areas from" should read -- areas form --.

Signed and Sealed this

Eighteenth Day of September, 2001

Attest:

NICHOLAS P. GODICI
Attesting Officer
Acting Director of the United States Patent and Trademark Office